United States Patent [19]

Renner et al.

[11] Patent Number: 4,796,216
[45] Date of Patent: Jan. 3, 1989

[54] LINEAR PREDICTIVE CODING TECHNIQUE WITH ONE MULTIPLICATION STEP PER STAGE

[75] Inventors: Karl H. Renner, Dallas; Alec J. Morton, Plano, both of Tex.

[73] Assignee: Texas Instruments Incorporated, Dallas, Tex.

[21] Appl. No.: 86,225

[22] Filed: Aug. 13, 1987

Related U.S. Application Data

[63] Continuation of Ser. No. 646,401, Aug. 31, 1984, abandoned.

[51] Int. Cl.⁴ .............................. G06F 7/38; G10L 5/02
[52] U.S. Cl. ........................................ 364/724; 381/51
[58] Field of Search ............................. 364/724; 381/51

[56] References Cited

U.S. PATENT DOCUMENTS

| | | | |
|---|---|---|---|
| 4,209,844 | 6/1980 | Brantingham et al. | 364/724 |
| 4,319,084 | 3/1982 | Lucchini et al. | 381/51 |
| 4,340,781 | 7/1982 | Ichikawa | 364/724 |
| 4,344,148 | 8/1982 | Brantingham et al. | 364/724 |
| 4,352,162 | 9/1982 | Nyuji et al. | 364/724 |
| 4,392,018 | 7/1983 | Fette | 381/51 |
| 4,398,262 | 8/1983 | Williams | 381/51 |
| 4,443,859 | 4/1984 | Wiggins | 364/724 |
| 4,554,858 | 11/1985 | Wachi et al. | 364/724 |
| 4,597,053 | 6/1986 | Chamberlin | 364/760 |
| 4,633,500 | 12/1986 | Yamada et al. | 381/51 |
| 4,644,488 | 2/1987 | Nathan | 364/724 |
| 4,686,644 | 8/1987 | Renner et al. | 381/51 |
| 4,695,910 | 9/1987 | Renner et al. | 381/51 |

FOREIGN PATENT DOCUMENTS 2103458  2/1983  United Kingdom ................ 381/51

Primary Examiner—Gary V. Harkcom
Assistant Examiner—Dale M. Shaw
Attorney, Agent, or Firm—William E. Hiller; N. Rhys Merrett; Melvin Sharp

[57] ABSTRACT

A digital filter for synthesized speech includes a full adder (72) that is multiplexed to perform multiplication and addition/subtraction operations. The inputs of the adder (72) are multiplexed by multiplexers (90) and (92). The adder (72) calculates Y-values and B-values. The B-values are input to a delay stack (116) and the Y-values are stored in a Y-register (78). One product is generated of a multiplier stored in a K-stack (128) and a multiplicand selected by a multiplexer (122). The multiplicand is a prestored summation that was earlier stored in a sum register (82). This product is stored in an ACC register (74) and utilized in both the calculation of the B-values and the Y-values. Therefore, only one multiplication is required for corresponding Y- and B-values, thereby reducing the number of multiplication steps required in processing each stage of a digital filter.

10 Claims, 3 Drawing Sheets

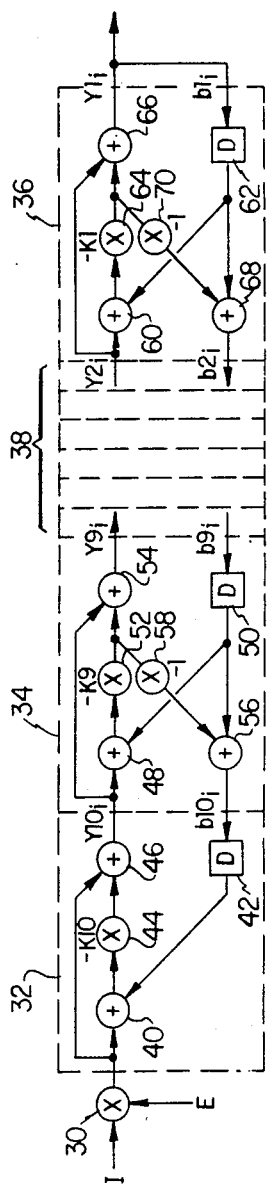
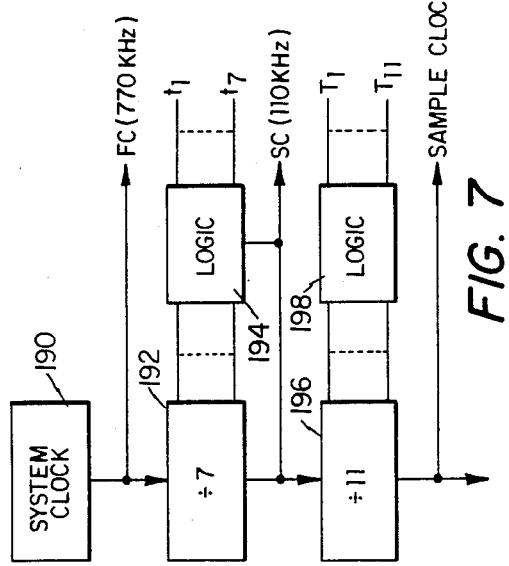
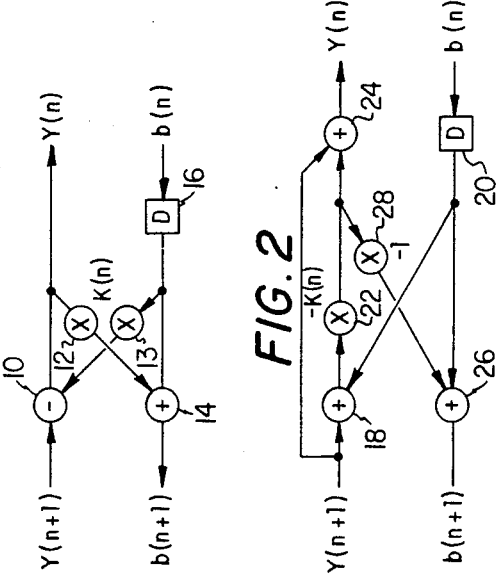

LINEAR PREDICTIVE CODING TECHNIQUE WITH ONE MULTIPLICATION STEP PER STAGE

This application is a continuation, of application Ser. No. 06/646,401, filed Aug. 31, 1984, now abandoned.

TECHNICAL FIELD OF THE INVENTION

The present invention pertains in general to speech synthesis and, more particularly, to a technique of voice compression utilizing linear predictive coding with a digital lattice filter.

CROSS REFERENCE TO RELATED APPLICATIONS

This application is related to patent application Ser. No. 646,868 filed Aug. 31, 1984, now U.S. Pat. No. 4,700,323 issued Oct. 13, 1987; patent application Ser. No. 646,381 filed Aug. 31, 1984 now U.S. Pat. No. 4,740,906 issued Apr. 26, 1988; Ser. No. 646,869 filed Aug. 31, 1984, now U.S. Pat. No. 4,695,970 issued Sept. 22, 1987; and patent application Ser. No. 646,606 filed Aug. 31, 1984, now U.S. Pat. No. 4,686,644 issued Aug. 11, 1987.

BACKGROUND OF THE INVENTION

Generation of complex synthesized sound such as speech requires some form of voice compression. One voice compression technique that has been heretofore utilized is linear predictive coding (LPC). LPC utilizes a digital lattice filter to model human speech from a set of prestored input parameters contained in a Read Only Memory (ROM). The LPC lattice filter typically is comprised of ten stages with each stage requiring two multiplications and two additions before passing the results backwards and forwards to its neighboring stages. The operations in the ten stages are carried out sequentially, as are the four operations within each stage. Processing of each prestored input parameter through the lattice filter results in a digital output value which is converted to an analog signal level and then amplified for output to a speaker or similar transducer.

In order to synthesize high quality speech with a digital lattice filter, it is necessary to process the prestored input parameters through the lattice filter at a repetition rate of approximately 10 kHz. To operate the lattice filter at this repetition rate, each stage must perform the digital operations therein within ten microseconds. The digital addition and/or subtraction operations required for each stage utilize a relatively straight forward process, whereas the digital multiplication operation is somewhat more complicated. Multiplication of two binary values requires iterative processing which may involve up to four separate additions to yield a product, depending upon the length of the digital values multiplied. The processing of the two multiplications and two additions for each stage can therefore require the generation of up to ten separate sums.

In view of the above disadvantages with present LPC techniques, there exists a need for improving the efficiency of processing information in each stage of a digital lattice filter. Primarily, it is desirous to reduce the number of multiplications required to synthesize quality speech.

SUMMARY OF THE INVENTION

The present invention disclosed and claimed herein comprises an apparatus for transforming prestored input values into audible sound according to a linear predictive coding technique. The apparatus includes a storage register for storing multiplier constants in a predetermined order and a digital filter with a plurality of stages for receiving the predetermined input value and outputting a digital value therefrom. The input data is cycled through a digital filter at a predetermined sample rate such that the digital filter values output from the digital filter for each cycle represent audible sound. Each stage of the digital filter processes the input value by the equations:

$$Y(n)_i = Y(n+1)_i - k(n)[Y(n+1)_i + b(n)_{i-1}]$$

$$b(n+1)_i = b(n)_{i-1} + k(n)[Y(n+1)_i + b(n)_{i-1}]$$

Processing of data with these equations requires only one multiplication for each stage of the digital filter and three addition/subtractions.

BRIEF DESCRIPTION OF THE DRAWINGS

For a more complete understanding of the present invention and the advantages thereof, reference is now made to the following description taken in conjunction with the accompanying Drawings in which:

FIG. 1 illustrates a functional block diagram for a representative stage of a digital lattice filter for a prior art system;

FIG. 2 illustrates a functional block diagram for a representative stage of a digital lattice filter in accordance with the present invention;

FIG. 3 illustrates a functional block diagram of a ten stage digital filter for processing of lattice equations in accordance with the present invention;

FIG. 7 illustrates a block diagram for the timing circuit to generate the fast and slow timing clocks and the T-times.

DETAILED DESCRIPTION OF THE INVENTION

Figure 4:
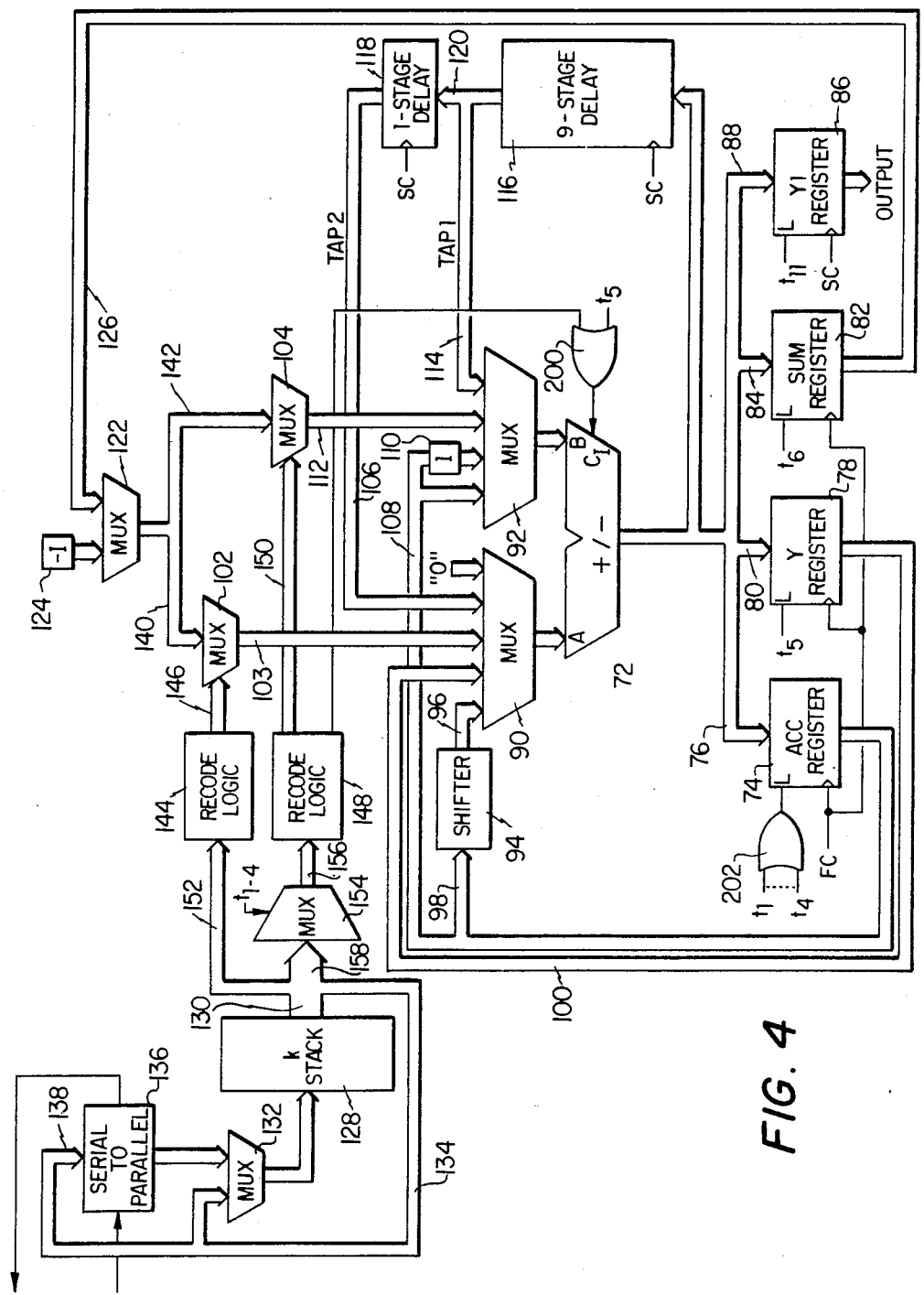
FIG. 4 illustrates a schematic diagram of the system for processing the lattice equations with one multiplication step per stage.

Speech synthesis using linear predictive coding (LPC) requires the processing of prestored input values through a digital lattice filter. One form of this digital lattice filter utilizes a series of twenty Equations, each equation requiring one multiplication and one addition or subtraction. Therefore, a total of twenty multiplications and twenty additions is required. The operation of this type of LP system is described in more detail in "Three-chip System Synthesizes Human Speech", Richard Wiggins and Larry Brantingham, *Electronics*, Aug. 31, 1978, pp. 109–116.

In the prior art system, each stage processes data to generate a "Y" value and a "B" value, the B-value being the reflection coefficient. The equations for calculating the Y- and B-values in accordance with the prior art method are as follows:

$$Y(n)_i = Y(n+1)_i - k(n)b(n)_{i-1} \qquad (1)$$

$$b(n+1)_i = b(n)_{i-1} + k(n)Y(n)_i \qquad (2)$$

where "n" represents the equation being processed and the stage in which it is processed and the subscript "i" represents the sample time in which the given value is generated. The sample time refers to the time required to process a prestored input parameter through the digital lattice filter and output a result. During the sample time, the reflection coefficients are calculated and delayed for use in the next sample time and they are denoted with the "i−1" subscript.

Referring now to FIG. 1, there is illustrated a functional diagram of one stage of the digital lattice filter utilizing the prior art multiplication technique wherein two multiplications are required for each stage. In this technique, the value of Y(n+1) generated in the previous stage is input to a subtraction block 10. The output of the subtraction block 10 is the value of Y(n). This value is input to a multiplication block 12 for multiplication by the constant k(n). The output of the multiplication block 12 is input to an addition block 14 which receives the value of the b(n) delayed by a delay block 16. The output of the addition block is b(n+1). The delayed value of b(n) is also input to a multiplication block 13 to multiply the delayed value of b(n) with the constant k(n). The output of the multiplication block 13 is input to the subtraction block 10 for subtraction from the value of Y(n+1) to generate the value of Y(n).

In the prior art device of FIG. 1, the constant k(n) must be multiplied by both the value of Y(n) to generate the reflection coefficient or B-value and also multiplied by the delayed value of b(n). This involves a multiplication of two digital values to provide a product therefor. Use of conventional multiplication techniques can require the generation of four or more sums to provide this product. In accordance with the present invention, a method is disclosed that utilizes only one multiplication and three sums to calculate the value of Y(n) and b(n) for each value of n.

Referring now to FIG. 2, there is illustrated a functional block diagram of one stage of the lattice filter in accordance with the present invention that processes the following equations in each stage:

$$Y(n)_i = Y(n+1)_i - k(n)[Y(n+1)_i + b(n)_{i-1}] \quad (3)$$

$$b(n+1)_i = b(n)_{i-1} + k(n)[Y(n+1)_i + b(n)_{i-1}] \quad (4)$$

The value of Y(n+1) that is generated in a previous stage is input to a summation block 18. The other input of the summation block 18 is connected to the output of a delay block 20 that receives the value of b(n) on the input thereof and delays this by one sample time. The output of the addition block 18 is the product of Y(n+1) and the delayed value of b(n). This product is multiplied by the value of −k(n) in a multiplication block 22 and then input to an addition block 24. The other input of the addition block 24 receives the value of Y(n+1) to output the value of Y(n). The delayed value of b(n) is also input to an addition block 26 with the other input thereof connected to the output of an inverter block 28 which multiplies the input value thereof by a "−1". The input to the inverter block 28 is the output of the multiplication block 22 which, as described above, is the product of the sum of the previous Y-value Y(n+1) and the delayed value of b(n) multiplied by the constants −k(n). The output of the addition block 26 is the value of b(n+1).

In order to process Equations 3 and 4 for each stage of the digital lattice filter, it is only necessary to generate one product for generating both the Y- and B-values in a given stage. In addition to this one multiplication, two additions and one subtraction are required for a total of four arithmetic operations per stage. As will be described hereinbelow, the multiplication step requires four additions such that a total of seven arithmetic sums must be performed per stage. This provides an advantage over the prior art method described above in that two multiplications and two additions were required, resulting in generation of ten sums, wherein four sums are required for each multiplication step.

For a ten stage filter, the Y-values are calculated according to the following Equations 5-14:

$$Y10_i = EI_i - k10[EI_i + b10_{i-1}] \quad (5)$$

$$Y9_i = Y10_i - k9[Y10_i + b9_{i-1}] \quad (6)$$

$$Y8_i = Y9_i - k8[Y9_i + b8_{i-1}] \quad (7)$$

$$Y7_i = Y8_i - k7[Y8_i + b7_{i-1}] \quad (8)$$

$$Y6_i = Y7_i - k6[Y7_i + b6_{i-1}] \quad (9)$$

$$Y5_i = Y6_i - k5[Y6_i + b5_{i-1}] \quad (10)$$

$$Y4_i = Y5_i - k4[Y5_i + b4_{i-1}] \quad (11)$$

$$Y3_i = Y4_i - k3[Y4_i + b3_{i-1}] \quad (12)$$

$$Y2_i = Y3_i - k2[Y3_i + b2_{i-1}] \quad (13)$$

$$Y1_i = Y2_i - k1[Y2_i + b1_{i-1}] \quad (14)$$

The B values are calculated according to the following Equations 15-24:

$$b10_i = b9_{i-1} k9[Y10_i + b9_{i-1}] \quad (15)$$

$$b9_i = b8_{i-1} + k8[Y9_i + b8_{i-1}] \quad (16)$$

$$b8_i = b7_{i-1} + k7[Y8_i + b7_{i-1}] \quad (17)$$

$$b7_i = b6_{i-1} + k6[Y7_i + b6_{i-1}] \quad (18)$$

$$b6_i = b5_{i-1} + k5[Y6_i + b5_{i-1}] \quad (19)$$

$$b5_i = b4_{i-1} + k4[Y5_i + b4_{i-1}] \quad (20)$$

$$b4_i = b3_{i-1} + k3[Y4_i + b3_{i-1}] \quad (21)$$

$$b3_i = b2_{i-1} + k2[Y3_i + b2_{i-1}] \quad (22)$$

$$b2_i = b1_{i-1} + k1[Y2_i + b1_{i-1}] \quad (23)$$

$$b1_i = Y1_i \quad (24)$$

The input energy level is represented by "E" and this is generated either internally from prestored parameters or from an external source. A term "I" represents an input excitation value which is representative of either random noise that is utilized in the generation of hissing sounds that are made during unvoiced speech or periodic sounds corresponding to voiced speech. A number of constants are provided that are prestored and labeled k1-k10 that describe the characteristics of the equations that correspond to the shape of the mouth and the position of the tongue and teeth in order to allow generation of the various sounds corresponding to speech. The B-values are labeled b1-b10 and are generated in a previous sample time. These previous calculated B-values are utilized to sequentially calculate the Y-values labeled Y1-Y10.

Initially, the value for $Y10_i$ is calculated according to Equation 1 utilizing the product of the input energy level E and the excitation energy $I_i$, the value of $b10_{i-1}$ and the value of k10. The product $EI_i$ is added to the value of $b10_{i-1}$ and then multiplied by the constant k10. This result is subtracted from $EI_i$. The next Y-value $Y9_i$ is then calculated utilizing this previous result $Y10_i$ and the value of $b9_{i-1}$ and the constant k9. The remaining values $Y8_i$ to $Y1_i$ are then calculated utilizing the delayed B-values from the previous sample time and then the B-values are calculated according to Equations 15-24. These generated B-values are delayed until the next sample time for use in calculating the next set of Y-values.

Referring now to FIG. 3, there is illustrated a functional block diagram of a ten stage lattice filter for processing Equations 5-24. The ten stage filter has a first stage 30, a second stage 34 and a tenth stage 36. The intermediate stages are defined by a reference numeral 38. The input energy I is input to a multiplication block 31 for multiplication by the excitation energy E to generate a product EI therefore. This product is input to the first stage 30 to an addition block 40 therein. The addition block 40 also receives the value $b10_{i-1}$ output from a delay block 42. The delay block 42 receives the value $b10_i$ on the input thereof. The output of the summation block 40 is the sum $EI+b10_{i-1}$. This product is input to a multiplication block 44 to generate the product $k10[EI+b10_{i-1}]$, which is input to an addition block 46. The addition block 46 has another input that is connected to the output of the multiplication block 30 for receiving the product EI and adding it with the product output by the multiplication block 44. The output of the addition block 46 is the value of $Y10_i$.

The value of $Y10_i$ is input to the second stage 34 to a summation block 48 therein. The summation block 48 receives the value of $b9_{i-1}$ that is output by a delay block 50, the input of which receives the value of $b9_i$ from the third stage in the intermediate stages 38. The output of the summation block 48 is the summation value $Y10_i+b9_{i-1}$, which is input to a multiplication block 52 for multiplication by the constant k2. The output of the multiplication block k2 is the value $k2[Y10_i+b9_{i-1}]$, which is input to a summation block 54. The other input of the summation block 54 receives the value $Y10_i$ on the input of the second stage 34, the output of the summation block 54 being the value $Y9_i$.

The output of the delay block 50 is also input to a summation block 56 that is internal to the second stage 34. The other input of the summation block 56 is connected to the output of an inversion block 58 which inverts the output value from the multiplication block 52. In effect, the inversion block 58 converts the operation of the summation block 56 to a subtraction operation. However, the values k9 and k10 have a negative sign such that an overall addition operation in accordance with Equations 15-24 is performed. The output of the summation block 56 is the value $b10_i$.

The last stage 36 receives the value of $Y2_i$ from the ninth stage for input to a summation block 60, the other input of which is connected to the output of a delay block 62 which is the value of $b1_{i-1}$. The output of the summation block $Y2_i$ is input to a multiplication block 62 to generate the product $-k1[Y2_i+b1_{i-1}]$. The output of the multiplication block 64 is input to a summation block 66 which has the other input thereof connected to the input value $Y2_i$ to generate the result $Y1_i$. The value of $Y1_i$ is also input to the delay block 62 in accordance with the Equation 24, which equates $Y1_i$ with the $b1_i$. The output of the delay block 62 is also input to a summation block 68, which has the other input thereof connected to the output of an inversion block 70 to which invert the value output by the multiplication block 64. The output of the summation block 68 is the value of $b2_i$.

With the ten stage lattice filter of FIG. 3, it is only necessary to perform one multiplication of two digital values, with one of the digital values being equal to one of the constants k(n), where n is equal to values between one and ten. Therefore, each stage requires a minimum of one multiplication operation, three addition operations, one inversion operation and a delay. Of these operations, the multiplication operation requires the longest time to perform. With conventional techniques, full adders are utilized in conjunction with an iterative multiplication algorithm to sum partial products and generate a product. In the preferred embodiment, the algorithm utilized is a modified Booth's algorithm which operates on a 15-bit multiplicand and a 10-bit multiplier to generate a 15-bit product. For a 10-bit multiplier, as will be described hereinbelow, five partial products must be generated, shifted and summed to generate the product, resulting in four summation operations.

Referring now to FIG. 4, there is illustrated a schematic block diagram of a system for realizing the digital lattice filter of FIG. 3 to process Equations 5-24. A single full adder 72 is multiplexed to perform all of the operations according to a predetermined multiplexing scheme. The single full adder 72 is a conventional adder which may be realized in circuitry in a number of ways. One circuit for a full adder circuit is described in U.S. Pat. No. 4,449,197, issued to J. L. Henry on May 15, 1984.

The full adder 72 has two inputs for receiving two 15-bit digital words and generating a 15-bit sum therefore. The inputs are multiplexed to perform a multiplication operation according to a modified Booth's algorithm, as will be described hereinbelow, and then subsequently perform multiplication and subtraction operations. The intermediate sums for the multiplication operations are stored in an accumulating register 74 which is connected to the output of the adder 72 through a 15-bit wide data bus 76. The accumulated register 74 will be referred to hereinafter as the "ACC" register 74. A Y-register 78 is connected to the output of the adder 72 through a 15-bit wide data bus 80 for storing Y-values therein. A sum register 82 is connected to the output of the adder 72 through a 15-bit wide data bus 84 and is utilized to store the intermediate sums that are used as the multiplicand for multiplication with the constants k1-k10. For example, the sum of Y9 and $b8_{i-1}$ is stored in the sum register 82 prior to calculation of $Y8_i$ in accordance with Equation 7. A Y1 register 86 is connected to the output of the full adder 72 through a 15-bit wide data bus 88 for storage of the Y1-value calculated in accordance with Equation 14.

Each of the registers 74, 78, 82 and 86 is controlled by a number of timing signals. These timing signals are derived from a fast clock signal (FC) and a slow clock signal (SC). In a given sample time, there are a number of T-times that have a duration equal to one cycle of the slow clock. There are eleven T-times utilized in the system of FIG. 4 noted $T_1$-$T_{11}$. Each of the T-times is in turn divided into seven equal timing segments denoted as $t_1$–$t_7$. These are referred to as "passes". Each of the passes has a duration equal to one cycle of the fast clock and determines the amount of time for the adder 72 to receive two digital values and generate the sum thereof. The relationship of the T-times and passes will be described in more detail hereinbelow.

The adder 72 has an "A" input and a "B" input with the A-input connected to the output of a multiplexer 90 and the B-input is connected to the output of a multiplexer 92. The multiplexer 90 has one input thereof connected to the output of a shifter circuit 94 through a 15-bit wide data bus 96. The input of the shifter circuit 94 is connected to the output of the ACC register 74 through a 15-bit wide data bus 98 and is operable to shift the data by predetermined number of bits. The shifter circuit 94 is implemented by "hard wiring" shift bus lines. Another input of the multiplexer 90 is connected to the output of the Y-register 78 through a 15-bit wide data bus 100 to receive Y-values therefrom. Another output of the multiplexer 90 is connected to the output of a multiplexer 122 through a 15-bit wide data bus 104 for receiving generated partial products for the multiplication operation and the fourth input is connected to a 15-bit wide data bus 106 labeled "TAP2". A fifth and final input is connected to a "0" value digital word wherein all of the logic bits therein are set to a logic "0".

The multiplexer 92 has four inputs thereto. The first input is connected directly to the output of the ACC register 74 through a 15-bit wide data bus 108 and a second input is connected to the data bus 108 through an inverter bank 110 labeled "1". The third input of the multiplexer 92 is connected to the output of a multiplexer 104 through a 15-bit wide data bus 112 and the fourth input thereof is connected to a 15-bit wide data bus 114 labeled "TAP1".

The output of the adder 72 is also connected to the input of a nine stage B-stack 116 that is a first-in first-out data register. The B-stack 116 is utilized to store B-values therein for nine clock cycles of the slow clock. The output of the B-stack 116 is connected to the data bus 114 denoted as TAP1 and also to the input of a one stage register 118 through an interconnecting bus 120. The one stage register 118 provides an additional stage of delay and has the output thereof connected to the data bus 106 denoted at TAP2. The B-stack 116 and the one stage register 118 effectively provide a ten stage first-in first-out register with a nine stage tap.

For the multiplication operation, a multiplicand is selected with a multiplexer 122. The multiplexer 122 has two inputs, one input of which is connected to a box 124 labeled "−I" and the other input thereof connected to the output of the sum register 82 through a 15-bit wide data bus 126. The block 124 represents an external data source for supplying input excitation data to the lattice filter of FIG. 3. The negative sign indicates that the negation or two's complement of I is supplied. The multipliers are the values of k1–k10 and the value of E which are stored in an eleven stage K-stack 128 which is a 10-bit wide first-in first-out data register having the output thereof connected to a 10-bit wide data bus 130 and the input thereof connected to the output of a multiplexer 132. The multiplexer 132 has two inputs, one of which is connected to the output data bus 130 through a feedback data bus 134 and the other of which is connected to the output of a serial-to-parallel converter 136. The input of the serial to parallel converter 136 is connected to the feedback bus 134 for receiving data from the output of the K-stack 128. The serial to parallel converter in conjunction with the multiplexer 132 allows alteration of data within the K-stack 128. However, when the multiplexer 132 connects the input of the K-stack 128 with the feedback data bus 134, the data in the K-stack circulates.

The multiplexers 102 and 104, as described above, are operable to generate partial products. The multiplexer 102 receives multiplicand data on the input therefrom from the multiplexer 122 through a 15-bit wide data bus 140 and the multiplexer 104 receives multiplicand data from the multiplexer 122 through a 15-bit wide data bus 142. The multiplexer 102 is controlled by a recode logic circuit 144 that is connected to the control input thereof through a data bus 146. The multiplexer 104 is controlled by a recode logic circuit 148 which is connected to the control input thereof through a data bus 150. The recode logic circuits 144 and 148 determine the operation that is to be performed upon the selected multiplicand to generate the appropriate partial product, as will be described hereinbelow.

The recode logic circuit 144 is connected to the two least significant bits of the 10-bit data word on the output data bus 130 through a two-bit wide data bus 152. The recode logic circuit 148 is connected to the output of a multiplexer 154 through a two-bit wide data bus 156. The multiplexer 154 has the input thereof connected to the eight most significant bits on the data bus 130 through an 8-bit wide data bus 158. The multiplexer 154 selects two-bit segments such that four two-bit words can be multiplexed to the data bus 156. For the multiplication operation, the multiplicands are a previously generated sum of a Y-value and a delayed B-value for processing of Equations 6–23 and sum of a delayed B-value and the product of E and $I_i$ for Equation 5. These previously calculated sums are stored in the sum register 82 and are selected as the multiplicand by the multiplexer 122. The addends for Equations 6–14 are previously calculated Y-values which are stored in the Y-register 78 and are selected for the A-input of the full adder 22 by the multiplexer 90. The addends for the Equations 15–23 are delayed B-values which are selected from the output of the one stage register 118 on TAP2. During the multiplication operation, the adder 72 is multiplexed to generate four sums to perform an iterative multiplication operation. During the first sum, the first partial product is generated by the multiplexer 102 and selected for input to the A-input of the adder 72. This occurs during the first pass $t_1$. During the same pass, the multiplexer 104 generates the second partial product and the multiplexer 92 selects this partial product for input to the B-input of the adder 72. The sum of the first two partial products is input to the ACC register 74, shifted by the shifting circuit 94 and input back to the A-input of the multiplexer 72. Thereafter, the remaining partial products are generated by the multiplexer 104 and summed with the intermediate partial product sums.

In the preferred embodiment, a ten bit multiplier is utilized with a modified Booth's algorithm. In this algorithm, five partial products are required for the multiplication operation. Therefore, two additional summations are required to add the fourth and fifth partial products. After the final product is generated, it is fed back into the multiplexer 92 on the data bus 108 for input to the B-input of the adder 72. An addend is selected from the output of the Y-register 78 for a Y-value and the output of the one stage register 118 for selection of a delayed B-value. In addition, a "0" value digital word can be selected. The final output of the adder 72 is either a Y-value or a B-value. Y-values are stored in the Y-register 78 and B-values are stored in the B-stack 116.

In accordance with the present invention, the product is first generated with a select constant from the K-stack 120 as the multiplier and the previously generated sum of a Y-value and delayed B-value as the multiplicand. Since this product is utilized for both the calculation of a Y-value and the calculation of a B-value, the Y-value is first calculated and stored in the Y-register 78 and then the B-value is calculated utilizing the same product. This product is stored in the ACC register 74 for use in the two operations. After generation of both a Y- and B-value, the Y-value is summed with the next delayed B-value and stored in the sum register 82 for use in generation of the next product.

In processing each of the Equations 5-24 with the system of FIG. 4, it is necessary to calculate a Y-value first by performing a subtraction and then a B-value by performing an addition then a multiplication followed by another addition. Subtraction is facilitated by generating the two's complement of the product. Since only a single full adder is utilized for calculation of the Y- or B-values, the operation thereof must be multiplexed during a given sample time. In the preferred embodiment, the multiplication scheme utilized is a modified Booth's algorithm. In this algorithm, it is necessary to analyze the multiplier output from the K-stack 128 by segmenting the multiplier into groups of three bits with one bit overlapping in each group with an implied bit to the right of the least significant bit. Therefore, a ten-bit multiplier will result in five 3-bit groups. Each group corresponds to a partial product, with a ten-bit multiplier requiring the generation of five partial products $PP_1$, $PP_2$, $PP_3$, $PP_4$ and $PP_5$. In order to generate these partial products, it is first necessary to determine the "modified Booth operator" to determine the operation that must be performed on a given multiplicand in order to generate the respective partial products. The modified Booth operators are "0" "+1", "−1", "+2" and "−2". The presence of a "−" requires the generation of the two's complement of the multiplicand and the presence of a "2" requires shifting of the multiplicand to the left by one bit with a "1" requiring no shift. Therefore, the partial products consist of the multiplicand or its two's complement shifted to the left by a maximum of one place. A modified Booth operator of "0" results in a partial product having all logic bits therein at a logic "0". The modified Booth operators are generated as shown in Table 1.

TABLE 1

| THREE-BIT GROUP | | | |
|---|---|---|---|
| A | B | C | OPERATOR |
| 0 | 0 | 0 | 0 |
| 0 | 0 | 1 | +1 |
| 0 | 1 | 0 | +1 |
| 0 | 1 | 1 | +2 |
| 1 | 0 | 0 | −2 |
| 1 | 0 | 1 | −1 |
| 1 | 1 | 0 | −1 |
| 1 | 1 | 1 | 0 |

After generation of the partial products, they are sequentially shifted by two places and added to the preceding partial products. This will require the adder to first sum $PP_1$ with $PP_2$ and then sequentially sum $PP_3$–$PP_5$ with the intermediate products, resulting in four summation operations. After the product has been generated, an additional summation is required to complete each of the Equations 5-24 by selecting a delayed B-value or a previously calculated Y-value for the addend.

In performing the multiplication operation, as described above, it is necessary to determine the operation that is to be performed on the multiplicand to generate the various partial products. The modified Booth operator for $PP_1$ is determined by the recode logic circuit 144 which receives the first two bits of the multiplier. Once the modified Booth operator is generated, the multiplexer 102 modifies the multiplicand to generate $PP_1$. For $PP_2$–$PP_4$, the multiplexer 154 selects the appropriate bits from the remaining eight bits of the multiplier and the recode logic circuit 148 generates a modified Booth operator in response to the selection of bits. This operator then controls the multiplexer 104 to determine the operation that is to be performed on the multiplicand for generating $PP_2$–$PP_5$.

In performing the multiplication, the multiplexer 90 selects the output of the multiplexer 102 to input $PP_1$ to the A-input of the adder 72 and the multiplexer 92 selects the output of the multiplexer 104 to input the value of $PP_2$ to the B-input of the adder 72. Since four summations are required for the multiplication operation, four clock cycles are generated to perform the the multiplication operation. These cycles are referred to as "passes" described above and are represented by the time periods "$t_1$", "$t_2$", "$t_3$" and "$t_4$". $PP_1$ and $PP_2$ are added during the period $t_1$. During this period, the multiplexer 154 selects the third and fourth bit of the multiplier word. During time period $t_2$, the summation of $PP_1$ and $PP_2$ is input to the A-input of adder 72 through the multiplexer 90 from the data bus 98 during $t_2$. In addition, the fifth and sixth bits of the multiplier word are selected by the multiplexer 154 and the modified Booth operator generated for $PP_3$. $PP_3$ is then input to the B-input of the adder 72 with the multiplexer 92. This summation is then input back to the A-input of the adder 72 for summation with $PP_4$ during $t_3$. $PP_5$ is added to this sum during $t_4$, the result being the product.

Figure 5:
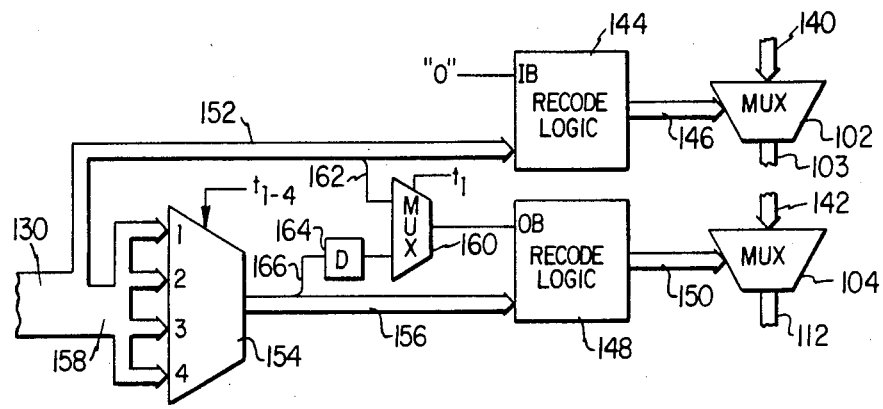
FIG. 5 illustrates a block diagram of the recode logic circuit for generating the modified Booth operators.

Referring now to FIG. 5, there is illustrated a schematic block diagram of the recode logic circuitry for generating the modified booth operators to modify the multiplicands, wherein like numerals refer to like parts in the various figures. The multiplexer 154 is controlled by the timing signals $t_1$–$t_4$ to select one of four input thereto. The inputs on the multiplexer 154 are labeled "1", "2", "3" and "4". The first two bits on the data bus 158 are input to the input labeled "1", the second two bits are input to the input labeled "2", the third two bits are input to the input labeled "3" and the fourth two bits are input to the input labeled "4". Depending upon which of the timing signals $t_1$–$t_4$ is present, one of these two bit inputs will be output to the data bus 156 for input to the recode logic circuit 148. As described above, the two least signficant bits on the data bus 130 are input to the recode logic circuit 144 on the data bus 152.

The recode logic circuit 144 analyzes the first two bits of the 10-bit multiplier word in addition to an implied bit. The implied bit is a logic "0" and this is input to an "IB" input on the recode logic circuit 144. One of the five modified booth operators is then generated and output to the multiplexer 102 on the data bus 146. The data bus 146 can be either a digitally encoded data word or five individual lines that control the operation of the multiplexer 102.

The recode logic circuit 148 analyzes the remaining eight bits of the 10-bit multiplier word. Since each of these three-bit groups is formed of two bits with the first bit overlapping the prior three-bit group, it is necessary to analyze the most significant bit from the previous three-bit group. For the first pass during $t_1$, a multiplexer 160 is provided with the output thereof input to an overflow bit "OB" input on the recode logic circuit 148. The multiplexer 160 has two inputs, one of which is connected through a one-bit line 162 to the most significant bit on the two-bit data bus 152. This provides the overflow bit for the first pass with the multiplexer 160 controlled by the signal $t_1$. During the same first pass, the most significant bit from the two-bit data bus 156 is input to a delay circuit 164 through a one-bit data line 166. The output of the delay circuit 164 is input to the multiplexer 160 to supply the overlap bit for the remaining sums. The delay 164 delays the selected bit on the one bit data bus 166 for one cycle of the fast clock or one pass. The recode logic circuit 148 then generates the appropriate modified Booth operator on the data bus 150 to control the operation of the multiplexer 104.

Figure 6:
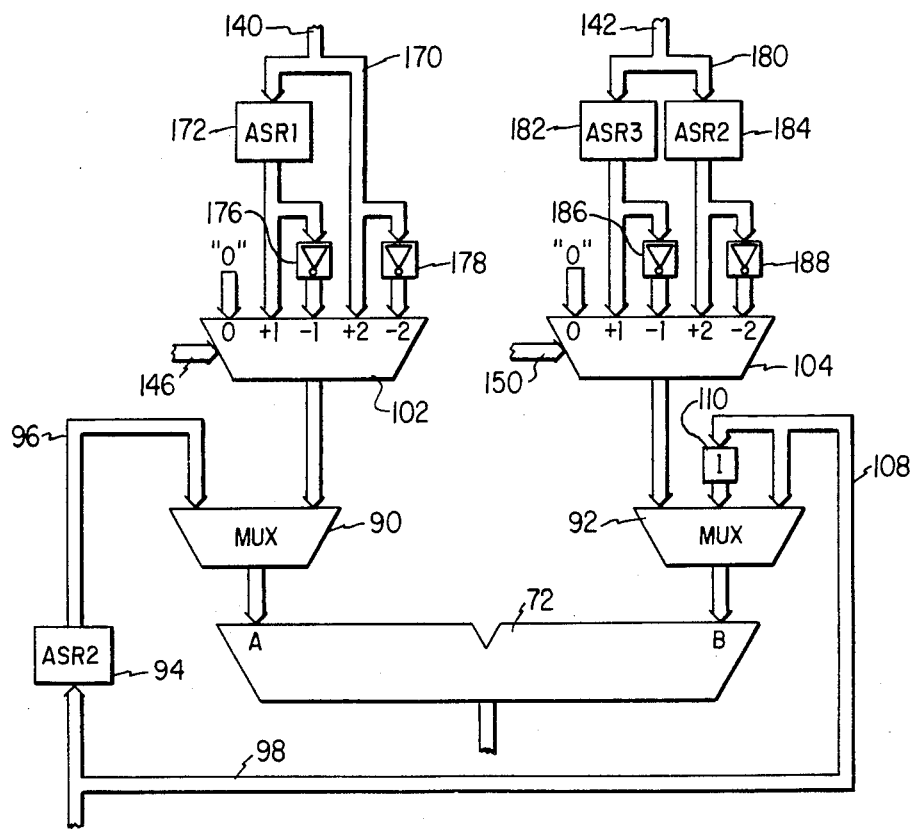
FIG. 6 illustrates a block diagram of the multiplexing circuit for reconfiguring the adder as a multiplier.

Referring now to FIG. 6, there is illustrated a schematic diagram of the adder 72 and the associated multiplexers for generating partial products $PP_1$-$PP_5$. Like numerals refer to like parts in the various figures. The multiplexer 102 has five inputs labeled "0", "+1" "−1", "+2" and "−2" corresponding to the five modified Booth operations. In the like manner, the multiplexer 104 has similarly labeled inputs. These inputs are selected by data that is output on either the data bus 146 or the data bus 150 from the recode logic circuits 144 and 148, respectively.

The data bus 140 that is input to the multiplexer 102 is branched into a two branch data bus 170 with one branch thereof input to a shifting block 172 and the other branch input directly to the multipliexer 102 and also to an inverter bank 178. The shifting block 172 is labeled "ASR1". The notation "ASR1" represents an arithmetic shift right of one bit where the most significant sign bit is extended or duplicated one time. The output of the shifting block 172 is directly input to the "+1" input of the multiplexer 102 and to the "−1" input thereof through an inverter bank 176. The "0" input of the multiplexer 102 is connected to a "0" value digital word having all of the logic bits therein said equal to a logic "0".

The data bus 142 is input to a two branch data bus 180 with one branch thereof input to a shifting block 182 and the other branch thereof input to a shifting block 184. The shifting block 182 is labeled "ASR3". The output of the shifting block 182 is directly input to the "+1" input of the multiplexer 104 and to the "−1" input thereof through an inverter bank 186.

The multiplicand that is selected and input to both the data buses 140 and 142 is modified by the circuitry associated with the multiplexers 102 and 104. The shifting blocks 172, 174, 182 and 94 shift the data words input thereto by a relative amount depending upon both the addition operation and the modified Booth operator. A moiified Booth operator of "+2" or "−2" results in no shift whereas a "+1" or "−1" operator results in a relative right shift by one bit. In addition, data on the B-input of adder 72 must be shifted two bits to the right with respect to the A-input data for each addend on the B-input. Therefore, the partial product generated by the multiplexer 104 is shifted two bits to the left with respect to the output of the multiplexer 102.

In order to explain the operation of the multiplication circuit of FIGS. 5 and 6, an example of digital multiplication using the modified Booth's algorithm is illustrated in Table 2.

TABLE 2

|     | 0.11010110011100 | = 13724 | *2**(−14) |
|-----|------------------|---------|-----------|
|     | 1.101011001      | = x(−167) | *2**(−9) |
| $PP_1$ | 00000000001101011001100 | +1 | |
| $PP_2$ | 111111100101001100100 | −2 | |
| $PP_3$ | 00000110101100111000 | +2 | |
| $PP_4$ | 000011010110011100 | +1 | |
| $PP_5$ | 1100101001100100 | −1 | |
|     | 11.1011101000001110011100 | = −2291908 | *2**(−23) |
| $PP_1$ | 000011010110011100 | +1 | |
| $PP_2$ | 1001010011001000 | −2 | |
| $\Sigma_1$ | 101000100010111 | | |
| $\Sigma_1$ | 11101000100010111 | | |
| $PP_3$ | 0110101100111000 | +2 | |
| $\Sigma_2$ | 010100111100001 | | |
| $\Sigma_2$ | 00010100111100001 | | |
| $PP_4$ | 0011010110011100 | +1 | |
| $\Sigma_3$ | 010010101000110 | | |
| $\Sigma_3$ | 00010010101000110 | | |
| $PP_5$ | 1100101001100100 | −1 | |
| final product | 1.10111010000011 | | |

In Table 2, the multiplier is a fifteen-bit fractional data word with a value of "13724*2**(−14)" and the multiplier is a ten-bit data word with a value of "−167*2**(−9)". The ten-bit multiplier requires the generation of five partial products which are generated by altering the multiplicand in accordance with the modified Booth operators that are generated. The modified Booth operator generated for $PP_1$ is "+1", "−2" for $PP_2$, "+2" for $PP_3$, "+1" for $PP_4$ and "−1" for $PP_5$. A "+1" indicates the operation whereby the multiplicand is not altered, a "−1" requires the two's complement to be generated, a "+2" requires the multiplicand to be shifted by one place to the left and a "−2" requires shifting one place to the left and generation of the two's complement of the multiplicand. Summation of the partial products requires shifting to the left by two places for each sequential partial product. For example, $PP_2$ is shifted to the left two places with respect to $PP_1$ and $PP_3$ is shifted two places to the left with respect to $PP_2$, etc. The shifting of two places to the left is facilitated by the shift block 94 which essentially "hardwires" the data bus 96 to provide a two bit shift with respect to the remaining data on the B-input of the adder 72.

Multiplication of a 15-bit number and a 10-bit number results in a 25-bit product which requires the sign bits to be extended to the left. This requires the sign bit of $PP_1$ to be extended, wherein ten zeros are added to the left. In a similar manner, $PP_2$ is extended eight additional sign bits, $PP_3$ is extended six additional sign bits, $PP_4$ is extended four additional sign bits and $PP_5$ is extended two additional sign bits. When the addition is complete, nine of the least significant bits and the most significant bit are truncated from the answer such that only a 15-bit product results, thereby reducing the need for a 25-bit output data bus. All of the bit shifting and two's complement generation is facilitated by the shifting circuits and inverter circuits such that the proper partial products can be generated and added to the shifted sum. The first shift between $PP_1$ and $PP_2$ is facilitated by the difference in bit shifting between the shifting blocks 172 and 174 and the shifting blocks 182 and 184. The remainder two-bit shift of the adder 72 is facilitated by the shifting block 94 on the summation output.

Referring now to FIG. 7, there is illustrated a block diagram of the system for generating the clock signals for timing. A system clock 190 is provided for outputting a fast clock signal (FC) of approximately 770 kHz. This system can operate at either a fundamental frequency of 770 kHz or it can be divided down from a higher and more stable operating frequency. The output of a system clock 990 is input to a divide-by-seven circuit 192 for generating a slow clock signal (SC) of 110 kHz. A logic circuit 194 is provided that is connected to both the FC and SC signals to divide each period of the slow clock into seven segments $t_1$-$t_7$. Each of these time periods $t_1$-$t_7$ is equal in duration to one period of the fast clock or 1.21 microseconds. Each cycle of a slow clock is equal to 8.9 microseconds. The output of the divide-by-seven circuit 196 is input to a divide-by-eleven circuit 196 to generate a sample clock operating at a frequency of 10 kHz. The sample clock determines the period of time within which a Y1 value is to be generated after processing the Equations 5–24.

The divide-by-eleven circuit 196 has the counting outputs thereof connected to the input of a logic circuit 198 for generating the T-times $T_1$-$T_{11}$. In addition, a slow clock is also input to the logic circuit 198. Each of the T-times $T_1$-$T_{11}$ have a period equal in duration to the slow clock frequency or 8.9 microseconds. Therefore, each period of the sample clock is divided into eleven equal segments, each of which has one multiplication and three additions performed therein.

To more clearly demonstrate the data flow through the system of FIG. 3 and the calculation of Equations 5–24, the status of all the registers is illustrated in Table 3 as a function of T-times $T_1$-$T_{11}$.

TABLE 3

| Time | | | | Adder | | | | | | | | |
| T | t | Mp | Mc | A | O/P | B | OUT | ACC | SUM | Y | TAP 1 | TAP 2 | Y1 |
|---|---|---|---|---|---|---|---|---|---|---|---|---|---|
| 1 | 1 | " | " | $PP_1$ | + | $PP_2$ | $\Sigma_1$ | " | " | " | $b10_{i-1}$ | $b11_{i-1}$ | $Y1_{i-1}$ |
|  | 2 | " | " | $\Sigma_1$ | + | $PP_3$ | $\Sigma_2$ | $\Sigma_1$ | " | " | " | " | " |
|  | 3 | " | " | $\Sigma_2$ | + | $PP_4$ | $\Sigma_3$ | $\Sigma_2$ | " | " | " | " | " |
|  | 4 | E | $-I_i$ | $\Sigma_3$ | + | $PP_5$ | $-EI_i$ | $\Sigma_3$ | " | " | " | " | " |
|  | 5 | " | " | 0 | – | $-EI_i$ | $EI_i$ | $-EI_i$ | " | " | " | " | " |
|  | 6 | " | " | $EI_i$ | + | $b10_{i-1}$ | $EI_i+b10_{i-1}$ | " | $EI_i$ | " | " | " | " |
|  | 7 | " | " | $b11_{i-1}$ | + | $-EI_i$ | " | " | $EI_i+b10_{i-1}$ | " | " | " | " |
| 2 | 1 | " | " | $PP_1$ | + | $PP_2$ | $\Sigma_1$ | " | " | " | $b9_{i-1}$ | $b10_{i-1}$ | " |
|  | 2 | " | " | $\Sigma_1$ | + | $PP_3$ | $\Sigma_2$ | $\Sigma_1$ | " | " | " | " | " |
|  | 3 | " | $EI_i$ | $\Sigma_2$ | + | $PP_4$ | $\Sigma_3$ | $\Sigma_2$ | " | " | " | " | " |
|  | 4 | k10 | + | $\Sigma_3$ | + | $PP_5$ | $k10(EI_i+b10_{i-1})$ | $\Sigma_3$ | " | " | " | " | " |
|  | 5 | " | $b10_{i-1}$ | $EI_i$ | – | $k10(EI_i+b10_{i-1})$ | $Y10_i$ | $k10(EI_i+b10_{i-1})$ | " | " | " | " | " |
|  | 6 | " | " | $Y10_i$ | + | $b9_{i-1}$ | $Y10_i+b9_{i-1}$ | $k10(EI_i+b10_{i-1})$ | " | $Y10_i$ | " | " | " |
|  | 7 | " | " | $b10_{i-1}$ | + | $k10(EI_i+b10_{i-1})$ | " | $k10(EI_i+b10_{i-1})$ | $Y10_i+b9_{i-1}$ | " | " | " | " |
| 3 | 1 | " | " | $PP_1$ | + | $PP_2$ | $\Sigma_1$ | " | " | " | $b8_{i-1}$ | $b9_{i-1}$ | " |
|  | 2 | " | " | $\Sigma_1$ | + | $PP_3$ | $\Sigma_2$ | $\Sigma_1$ | " | " | " | " | " |
|  | 3 | " | $Y10_i$ | $\Sigma_2$ | + | $PP_4$ | $\Sigma_3$ | $\Sigma_2$ | " | " | " | " | " |
|  | 4 | k9 | + | $\Sigma_3$ | + | $PP_5$ | $k9(Y10_i+b9_{i-1})$ | $\Sigma_3$ | " | " | " | " | " |
|  | 5 | " | $b9_{i-1}$ | $Y10_i$ | – | $k9(Y10_i+b9_{i-1})$ | $Y9_i$ | $k9(Y10_i+b9_{i-1})$ | " | " | " | " | " |
|  | 6 | " | " | $Y9_i$ | + | $b8_{i-1}$ | $Y9_i+b8_{i-1}$ | $k9(Y10_i+b9_{i-1})$ | " | $Y9_i$ | " | " | " |
|  | 7 | " | " | $b9_{i-1}$ | + | $k9(Y10_i+b9_{i-1})$ | $b10_i$ | $k9(Y10_i+b9_{i-1})$ | $Y9_i+b8_{i-1}$ | " | " | " | " |
| 4 | 1 | " | " | $PP_1$ | + | $PP_2$ | $\Sigma_1$ | " | " | " | $b7_{i-1}$ | $b8_{i-1}$ | " |
|  | 2 | " | " | $\Sigma_1$ | + | $PP_3$ | $\Sigma_2$ | $\Sigma_1$ | " | " | " | " | " |
|  | 3 | " | $Y9_i$ | $\Sigma_2$ | + | $PP_4$ | $\Sigma_3$ | $\Sigma_2$ | " | " | " | " | " |
|  | 4 | k8 | + | $\Sigma_3$ | + | $PP_5$ | $k8(Y9_i+b8_{i-1})$ | $\Sigma_3$ | " | " | " | " | " |
|  | 5 | " | $b8_{i-1}$ | $Y9_i$ | – | $k8(Y9_i+b8_{i-1})$ | $Y8_i$ | $k8(Y9_i+b8_{i-1})$ | " | " | " | " | " |
|  | 6 | " | " | $Y8_i$ | + | $b7_{i-1}$ | $Y8_i+b7_{i-1}$ | $k8(Y9_i+b8_{i-1})$ | " | $Y8_i$ | " | " | " |
|  | 7 | " | " | $b8_{i-1}$ | + | $k8(Y9_i+b8_{i-1})$ | $b9_i$ | $k8(Y9_i+b8_{i-1})$ | $Y8_i+b7_{i-1}$ | " | " | " | " |
| 5 | 1 | " | " | $PP_1$ | + | $PP_2$ | $\Sigma_1$ | " | " | " | $b6_{i-1}$ | $b7_{i-1}$ | " |
|  | 2 | " | " | $\Sigma_1$ | + | $PP_3$ | $\Sigma_2$ | $\Sigma_1$ | " | " | " | " | " |
|  | 3 | " | $Y8_i$ | $\Sigma_2$ | + | $PP_4$ | $\Sigma_3$ | $\Sigma_2$ | " | " | " | " | " |
|  | 4 | k7 | + | $\Sigma_3$ | + | $PP_5$ | $k7(Y8_i+b7_{i-1})$ | $\Sigma_3$ | " | " | " | " | " |
|  | 5 | " | $b7_{i-1}$ | $Y8_i$ | – | $k7(Y8_i+b7_{i-1})$ | $Y7_i$ | $k7(Y8_i+b7_{i-1})$ | " | " | " | " | " |
|  | 6 | " | " | $Y7_i$ | + | $b6_{i-1}$ | $Y7_i+b6_{i-1}$ | $k7(Y8_i+b7_{i-1})$ | " | $Y7_i$ | " | " | " |
|  | 7 | " | " | $b7_{i-1}$ | + | $k7(Y8_i+b7_{i-1})$ | $b8_i$ | $k7(Y8_i+b7_{i-1})$ | $Y7_i+b6_{i-1}$ | " | " | " | " |
| 6 | 1 | " | " | $PP_1$ | + | $PP_2$ | $\Sigma_1$ | " | " | " | $b5_{i-1}$ | $b6_{i-1}$ | " |
|  | 2 | " | " | $\Sigma_1$ | + | $PP_3$ | $\Sigma_2$ | $\Sigma_1$ | " | " | " | " | " |
|  | 3 | " | $Y7_i$ | $\Sigma_2$ | + | $PP_4$ | $\Sigma_3$ | $\Sigma_2$ | " | " | " | " | " |
|  | 4 | k6 | + | $\Sigma_3$ | + | $PP_5$ | $k6(Y7_i+b6_{i-1})$ | $\Sigma_3$ | " | " | " | " | " |
|  | 5 | " | $b6_{i-1}$ | $Y7_i$ | – | $k6(Y7_i+b6_{i-1})$ | $Y6_i$ | $k6(Y7_i+b6_{i-1})$ | " | " | " | " | " |
|  | 6 | " | " | $Y6_i$ | + | $b5_{i-1}$ | $Y6_i+b5_{i-1}$ | $k6(Y7_i+b6_{i-1})$ | " | $Y6_i$ | " | " | " |
|  | 7 | " | " | $b6_{i-1}$ | + | $k6(Y7_i+b6_{i-1})$ | $b7_i$ | $k6(Y7_i+b6_{i-1})$ | $Y6_i+b5_{i-1}$ | " | " | " | " |

TABLE 3-continued

| Time | | | | Adder | | | | | | | |
|---|---|---|---|---|---|---|---|---|---|---|---|---|
| T | t | Mp | Mc | A | O/P | B | OUT | ACC | SUM | Y | TAP 1 | TAP 2 | Y1 |
| 7 | 1 | " | " | $PP_1$ | + | $PP_2$ | $\Sigma_1$ | $b6_{i-1}$ | " | " | $b4_{i-1}$ | $b5_{i-1}$ | " |
|   | 2 | " | " | $\Sigma_1$ | + | $PP_3$ | $\Sigma_2$ | $\Sigma_1$ | " | " | " | " | " |
|   | 3 | " | $Y6_i$ | $\Sigma_2$ | + | $PP_4$ | $\Sigma_3$ | $\Sigma_2$ | " | " | " | " | " |
|   | 4 | k5 | + | $\Sigma_3$ | + | $PP_5$ | $k5(Y6_i+b5_{i-1})$ | $\Sigma_3$ | " | " | " | " | " |
|   | 5 | " | $b5_{i-1}$ | $Y6_i$ | − | $k5(Y6_i+b5_{i-1})$ | $Y5_i$ | $k5(Y6_i+b5_{i-1})$ | " | " | " | " | " |
|   | 6 | " | " | $Y5_i$ | + | $b4_{i-1}$ | $Y5_i+b4_{i-1}$ | $k5(Y6_i+b5_{i-1})$ | " | $Y5_i$ | " | " | " |
|   | 7 | " | " | $b5_{i-1}$ | + | $k5(Y6_i+b5_{i-1})$ | $b6_i$ | $k5(Y6_i+b5_{i-1})$ | $Y5_i+b4_{i-1}$ | " | " | " | " |
| 8 | 1 | " | " | $PP_1$ | + | $PP_2$ | $\Sigma_1$ | " | " | " | $b3_{i-1}$ | $b4_{i-1}$ | " |
|   | 2 | " | " | $\Sigma_1$ | + | $PP_3$ | $\Sigma_2$ | $\Sigma_1$ | " | " | " | " | " |
|   | 3 | " | $Y5_i$ | $\Sigma_2$ | + | $PP_4$ | $\Sigma_3$ | $\Sigma_2$ | " | " | " | " | " |
|   | 4 | k4 | + | $\Sigma_3$ | + | $PP_5$ | $k4(Y5_i+b4_{i-1})$ | $\Sigma_3$ | " | " | " | " | " |
|   | 5 | " | $b4_{i-1}$ | $Y5_i$ | − | $k4(Y5_i+b4_{i-1})$ | $Y4_i$ | $k4(Y5_i+b4_{i-1})$ | " | " | " | " | " |
|   | 6 | " | " | $Y4_i$ | + | $b3_{i-1}$ | $Y4_i+b3_{i-1}$ | $k4(Y5_i+b4_{i-1})$ | " | $Y4_i$ | " | " | " |
|   | 7 | " | " | $b4_{1-1}$ | + | $k4(Y5_i+b4_{i-1})$ | $b5_i$ | $k4(Y5_i+b4_{i-1})$ | $Y4_i+b3_{i-1}$ | " | " | " | " |
| 9 | 1 | " | " | $PP_1$ | + | $PP_2$ | $\Sigma_1$ | " | " | " | $b2_{i-1}$ | $b3_{i-1}$ | " |
|   | 2 | " | " | $\Sigma_1$ | + | $PP_3$ | $\Sigma_2$ | $\Sigma_1$ | " | " | " | " | " |
|   | 3 | " | $Y4_i$ | $\Sigma_2$ | + | $PP_4$ | $\Sigma_3$ | $\Sigma_2$ | " | " | " | " | " |
|   | 4 | k3 | + | $\Sigma_3$ | + | $PP_5$ | $k3(Y4_i+b3_{i-1})$ | $\Sigma_3$ | " | " | " | " | " |
|   | 5 | " | $b3_{i-1}$ | $Y4_i$ | − | $k3(Y4_i+b3_{i-1})$ | $Y3_i$ | $k3(Y4_i+b3_{i-1})$ | " | " | " | " | " |
|   | 6 | " | " | $Y3_i$ | + | $b2_{i-1}$ | $Y3_i+b2_{i-1}$ | $k3(Y4_i+b3_{i-1})$ | " | $Y3_i$ | " | " | " |
|   | 7 | " | " | $b3_{i-1}$ | + | $k3(Y4_i+b3_{i-1})$ | $b4_i$ | $k3(Y4_i+b3_{i-1})$ | $Y3_i+b2_{i-1}$ | " | " | " | " |
| 10 | 1 | " | " | $PP_1$ | + | $PP_2$ | $\Sigma_1$ | " | " | " | $b1_{i-1}$ | $b2_{i-1}$ | " |
|   | 2 | " | " | $\Sigma_1$ | + | $PP_3$ | $\Sigma_2$ | $\Sigma_1$ | " | " | " | " | " |
|   | 3 | " | $Y3_i$ | $\Sigma_2$ | + | $PP_4$ | $\Sigma_3$ | $\Sigma_2$ | " | " | " | " | " |
|   | 4 | k2 | + | $\Sigma_3$ | + | $PP_5$ | $k2(Y3_i+b2_{i-1})$ | $\Sigma_3$ | " | " | " | " | " |
|   | 5 | " | $b2_{i-1}$ | $Y3_i$ | − | $k2(Y3_i+b2_{i-1})$ | $Y2_i$ | $k2(Y3_i+b2_{i-1})$ | " | " | " | " | " |
|   | 6 | " | " | $Y2_i$ | + | $b1_{i-1}$ | $Y2_i+b1_{i-1}$ | $k2(Y3_i+b2_{i-1})$ | " | $Y2_i$ | " | " | " |
|   | 7 | " | " | $b2_{i-1}$ | + | $k2(Y3_i+b2_{i-1})$ | $b3_i$ | $k2(Y3_i+b2_{i-1})$ | $Y2_i+b1_{i-1}$ | " | " | " | " |
| 11 | 1 | " | " | $PP_1$ | + | $PP_2$ | $\Sigma_1$ | " | " | " | $b11_{i-1}$ | $b1_{i-1}$ | " |
|   | 2 | " | " | $\Sigma_1$ | + | $PP_3$ | $\Sigma_2$ | $\Sigma_1$ | " | " | " | " | " |
|   | 3 | " | $Y2_i$ | $\Sigma_2$ | + | $PP_4$ | $\Sigma_3$ | $\Sigma_2$ | " | " | " | " | " |
|   | 4 | k1 | + | $\Sigma_3$ | + | $PP_5$ | $k1(Y2_i+b1_{i-1})$ | $\Sigma_3$ | " | " | " | " | " |
|   | 5 | " | $b1_{i-1}$ | $Y2_i$ | − | $k1(Y2_i+b1_{i-1})$ | $Y1_i$ | $k1(Y2_i+b1_{i-1})$ | " | " | " | " | " |
|   | 6 | " | " | $Y1_i$ | + | $b11_{i-1}$ | $Y1_i+b11_{i-1}$ | $k1(Y2_i+b1_{i-1})$ | " | $Y1_i$ | " | " | " |
|   | 7 | " | " | $b1_{i-1}$ | + | $k1(Y2_i+b1_{i-1})$ | $b2_i$ | $k1(Y2_i+b1_{i-1})$ | $Y1_i+b11_{i-1}$ | " | " | " | " |

The data at the output of the K-stack 128 is contained in the column labeled "Mp" representing the multiplier. The multiplicand selected by the multiplexer 122 is represented by the column labeled "Mc". The operation of the adder is illustrated with the data input on the A- and B-inputs thereto and the output therefrom. Each of the output storage registers 74, 80, 82 and 86 are contained in the column bearing the respective labels. The data output by the B-stack 116 is represented in the column labeled "TAP1" and the data output from the one stage register 118 is in the column labeled "TAP2".

Each of the T-times $T_1$-$T_{11}$ is divided up into seven individual time periods $t_1$-$t_7$. In order to describe the operation of the system, the time periods $t_1$-$t_7$ will be individually stepped through for representative T-times. In $T_1$, a sample period is initiated by generating $PP_1$ and $PP_2$ with the multiplexers 102 and 104, respectively. $PP_1$ is input to the A-input of the adder 72 and $PP_2$ is input to the B-input thereof. The output from the adder is the first intermediate sum $\Sigma 1$. This value is then clocked into the ACC register 74 and is present there during $t_2$. The multiplexer 90 selects the output of the ACC register 74 for input to the A-input of the adder 72 and $PP_3$ is input to the B-input thereof. The intermediate sum $\Sigma 2$ is generated and is clocked into the ACC register 74 at the beginning of $t_3$. This value is also input to the A-input of the adder 72 with $PP_4$ generated and input to the B-input thereof. The intermediate sum for these two values is $\Sigma 3$ which is clocked into the ACC register 74 at the beginning of $t_4$. During $t_4$, $\Sigma 3$ and $PP_5$ are added to generate the final product.

During $T_1$, the value of E is present on the top of the K-stack 128 as the multiplier and the value of $-I_i$ is selected from the block 124 by the multiplexer 122 as the multiplicand. This results in the product of $-EI_i$ generated on the output of the adder 72. This value is clocked into the ACC register 74 during $t_5$. During $t_5$, the "0" value digital word is selected by the multiplexer 90 for input to the A-input of the adder 72 and the output of the ACC register 74 with the value of $-EI_i$ stored therein for input to the B-input of the adder 72. The operation performed during $t_5$ is a subtraction operation which is implemented by generating the two's complement thereof. This is implemented by inverting the logic bits thereof with the inverter block 110 and simultaneously forcing the carry input of the adders 72 to a logic "high". The carry input is controlled by an OR gate 200 which has one input thereof connected to the output of the recode logic circuit 148 and one input connected to the timing signal $t_5$.

The result of the operation during $T_1$ and the period $t_5$ is the value $EI_i$ which is stored in the Y register 78. The Y-register 78 is clocked by the fast clock and the timing signal $t_5$ to store values only during $t_5$. The ACC register 74 is controlled by the timing signals $t_1$-$t_4$. These timing signals are input to a four input OR gate 202 which is input to the load input of the register 74. Therefore, the output values generated by the adder 72 during $t_1$-$t_4$ are stored in the ACC register 74 and the values output during $t_5$ are stored intthe Y-register 78.

During $t_6$ and T-time $T_1$, the value of $EI_i$ stored in the Y-register 78 is selected for input to the A-input of the adder 72 by the multiplexer 90 and the output value on TAP1 from the stack 116 is selected for input to the B-input thereof. This results in the sum $EI_i + b10_{i-1}$. The value of $b10_{i-1}$ was generated nine clock cycles of the slow clock prior to T-time $T_1$ in the prior sample time. This value is stored in the sum register 82 which is clocked by both the fast clock and a load signal connected to the timing signal $t_6$.

During $t_7$ and T-time $T_1$, the value of $b11_{i-1}$ is selected from TAP2 of the register 118 and input to the A input of the adder 72 with the value of $-EI_i$ stored in the Y-register 78 input to the B-input of the adder 72. This results in $b11_i - E1_i$, which is discarded.

Upon initiation of the next T-time, the K-stack 128 is incremented and the value of k10 is on the top thereof as the multiplier with the multiplicand being selected from the sum register 82. The product of k10 and $EI_i + b10_{i-1}$ is generated and stored in the ACC register 74. As described above with reference to Equations 5-24, this product is utilized for both the calculation of the value of $Y10_i$ in accordance with Equation 1. The value of $Y10_i$ is generated during $t_5$ and T-time $T_2$ and this value is stored in the Y-register 78 at the transition between $t_5$ and $t_6$. The sum of $Y10_i$ and $b9_{i-1}$ is generated during $t_6$ and stored in the sum register 82 for use as the multiplicand in T-time $T_3$. During $t_7$ and T-time $T_2$, the value of $b10_{i-1}$ from TAP2 and the product generated in the multiplication operation in $T_2$ is the value of b11i which is stored in the bottom of B-stack 116. However, as described above, this is a discarded value which appears nine cycles of the slow clock later on the TAP1 output and ten cycles of the slow clock later on the output of the register 118.

During T-time $T_3$, the value of $K_9$ is on the top of the K-stack 128 and the multiplicand stored in the sum register 82 is the value of $Y10_i + b9_{i-1}$. The product generated is stored in the ACC register 74 for use in calculating $Y9_i$ and $b10_i$.

Each Y-value generated is stored in the Y-register 78 for use in calculation of both the Y- and B-values for the next T-time until Y1i is generated. At this time, the Y1i value is stored in the $Y_1$ register 86, which is controlled by the slow clock signal and the $T_{11}$ signal on the load input. This occurs in T-time $T_{11}$ at the end thereof such that it appears at the beginning of T-time $T_1$ during the period $t_j$. The B-values generated during $t_7$ in each of the T-times is stored in the bottom of the B-stack 116 and appears on TAP1 at the output thereof nine cycles of the slow clock later. For example, $b10_i$ is generated during $t_3$ and it appears as $b10_{i-1}$ during T-time $T_1$ in the next sample period or nine clock cycles later. Ten clock cycles later, it appears on the output TAP2 from the one stage register 118.

By utilizing the system in accordance with the present invention, eleven T-times are required with seven passes occurring during each T-time. This results in the generation of 77 sums. The multiplexer utilized to generate these sums for a 10 kHz sampling speed need only operate at a 770 kHz rate with the slow clock operating at 110 kHz rate. This results in the use of a slow adder which is simpler to realize in circuitry.

In summary, there has been provided a method for processing equations in a linear predictive coding technique by utilizing a digital lattice filter which requires only one multiplication and three sums for each stage. The equations require only one product to be generated which is used to calculate both a Y- and a B-value. This reduces the need for two multiplications in each stage of the digital lattice filter. The multiplication circuit utilized to multiply two digital values is a full adder which requires four passes through the adder utilizing a modified Booth's algorithm to generate the product. The adder is multiplexed with output registers to store the various intermediate sums for use in subsequent calculations of Y- and B-values.

Although the preferred embodiment has been described in detail, it should be understood that various changes, substitutions and alterations can be made therein without departing from the spirit and scope of the invention as defined by the appended claims.

What is claimed is:

1. A digital lattice filter having n-operational stages for calculating Y-values and b-values for a linear predictive coding voice compression technique in accordance with the following equations:

$$Y(n)_i = Y(n+1)_i - k(n)(Y(n+1)_i + b(n)_{i-1})$$

$$b(n+1)_i = b(n)_{i-1} + k(n)(Y(n+1)_i + b(n)_{i-1})$$

wherein:
n is the operational stage in which the equation is being processed,
i is the sample time required to process the equations through the n operational stages, and
k is a multiplier constant, there being n multiplier constants, said digital lattice filter comprising:
multiplier storage means for storing the k multiplier constants in a predetermined order for output in each of the n-operational stages as a function of the value of n;
b-delay storage means for receiving generated b-values in the i sample time and decaying the received b-values for output as $b(n)_{i-1}$ in the next $i+1$ sample time;
Y-storage means for receiving the value of $Y(n)_i$ for a given n for output as $Y(n+1)_i$ in the subsequent $n-1$ stage of operation;
processor means having stages each for receiving the value $b(n)_{i-1}$ from said b-delay storage means, a multiplier constant k(n) for a given n from said mulitplier storage means, and the value $Y(n+1)_i$ from said Y-storage means, said processor means generating the sum $Y(n+1)_i + b(n)_{i-1}$ and multiplying the generated sum by k(n) to provide the product $k(n)(Y(n+1)_i + b(n)_{i-1})$, said processor means subtracting said product from $Y(n+1)_i$ to provide the value of $Y(n)_i$ and adding said product to $b(n)_{i-1}$ to generate the value of $b(n+1)_i$, said processor means outputting the generated values of $Y(n)_i$ and $b(n+1)_i$ to said Y storage means and said b-delay storage means, respectively; and means for cycling the value of n for a given i sample time form a predetermined maximum value to a predetermined minimum value and controlling said b-delay storage means and said multiplier storage means to output stored data as a function of the value of $n_i$.

2. A digital lattice filter as set forth in claim 1, wherein said processor means comprises:

adder/substractor means for generating the sum or difference of two values;

multiplier means for generating the product of two values;

control means for controlling said multiplier means and said adder/subtractor means so as to generate the values $Y(n)_i = Y(n+1)_i - k(n) \ (Y(n+1)_i + b(-n)_{i-1})$ and $b(n+1)_i = b(n)_{i-1} + k(n)(Y(n+1)_i + b(-n)_{i-1})$ by first adding the value of $Y(n+1)_i$ to the delayed value of $b(n)_{i-1}$ with said adder/subtractor means to provide the sum $(Y(n+1)_i + b(n)_{i-1})$ and then multiplying this sum by the multiplier constant $k(n)$ with said multiplier means to provide the generated product $k(n)(Y(n+1)_i + b(n)_{i-1})$;

said control means controlling said adder/subtractor means to subtract said generated product form $Y(n+1)_i$ to generate the value of $Y(n)_i$ and add the generated product to $b(n)_{i-1}$ to generate the $b(n+1)_i$ value;

timing means responsive to the decrementing value of n by said cycling means to process the Y-values and b-values with said control means; and output means for storing the value of $Y(n)_i$ in said Y-storage means and the vlaue of $b(n+1)_i$ in said b-delay storage means for each value of n.

3. A digital lattice filter as set forth in claim 1, wherein said processor means comprises:

means for summing the values of $Y(n+1)_i + b(n)_{i-1}$;

means for multiplying the intermediate sum with the multiplier constant $k(n)$ stored in said multiplier storage means to generate the product $k(n) \ (Y(n+1)_i + b(n)_{i-1})$;

means for storing sadd generated product;

means for subtracting said stored generated product from the value of $Y(n+1)_i$ to generate the value of $Y(n)_i$;

means for storing the generated value of $Y(n)_i$ in said Y-storage means;

means for adding said stored generated product with the value of $b(n)_{i-1}$ to generate the value of $b(n+1)_i$;

means for storing the generated value of $b(n+1)_i$ in said b-delay storage means for use in subsequent processing as the value $b(n)_{i-1}$; and means responsive to the decrementing value of n by said cycling means to process and output the Y-values and b-values.

4. A digital lattice filter as set forth in claim 1, wherein said processor means comprises:

a full adder for receiving two values and generating the sum thereof;

multiplier means for interfacing with said adder to generate and sum partial products of a multiplier and a multiplicand in accordance with a modified Booth's algorithm for a mulitplication operation to generate a product;

a sum register for storing the value of $Y(n+1)_i + b(-n)_{i-1}$;

a product register for storing a product;

control means for controlling said adder and said multiplier means such that (a) said adder first adds the value of $Y(n+1)_i + b(-n)_{i-1}$, with the sum being stored in said sum register;

(b) said multiplier means then multiplies said sum in said sum register by $k(n)$ to generate the product $k(n)(Y(n+1)_i + b(n)_{i-1})$ with the product being stored in said product register;

(c) said adder inverts the value stored in said product register and adds the inverted value with the value of $Y(n+1)_i$ to generate the value of $Y(n)_i$ for storage in said Y-storage means;

(d) said adder adds said stored product with the value of $b(n)_{i-1}$ to generate the value of $b(n+1)_i$ for storage in said b-delay storage means; and means responsive to the decrementing of the value of n by said cycling means after the value of $b(n+1)_i$ is calculated to process the Y-values and b-values for the next successive value of n.

5. A digital lattice filter having n-operational stages for calculating Y-values and b-values according to a linear predictive coding voice compression technique in accordance with the following equations:

$$Y(n)_i = Y(n+1)_i - k(n)(Y(n+1)_i + b(n)_{i-1})$$

$$b(n+1)_i = b(n)_{i-1} + k(n)(Y(n+1)_i + b(n)_{i-1})$$

where:

n is the operational stage of the lattice filter through which the equation is being processed, n+1 is the previous equation that was processed in the previous stage, i is the set of equations being processed for values of n ranging from a maximum to a minimum value and representing one cycle of the lattice filter, i−1 is a set of equations calculated in a previous cycle for the ith set, Y is the forward transfer coefficient, b is the reflection coefficient, and k is the multiplier constant, said digital lattice filter comprising:

multiplier storage means for storing the values of $k(n)$ as multiplier constants in a predetermined order as a function of n, said multiplier storage means outputting the value of $k(m)$ corresponding to the n-operational stage being processed;

a full adder for receiving two digital values and generating the sum thereof;

multiplier means for selectively interfacing with said full adder for multiplication of a select one of said multiplier constants $k(n)$ stored in said multiplier storage means and a multiplicand by generating and summing partial products in accordance with a predetermined multiplication algorithm to generate a product;

delay storage means for selectively receiving and storing the output from said adder in the i sample time and delaying the stored value for a predetermined duration for output as $b(n)_{i-1}$ in the next i sample time;

product storage means for storing products generated by said multiplier means;

sum storage means for storing the sum $(Y(n+1)_i + b(-n)_{i-1})$ output by said adder;

register measn for storing Y(n)$_i$ for output as Y(n+1)$_i$ for each successive value of n;

processor means for calculating the Y-values and b-values for a given n using the value of b(n)$_{i-1}$ from said delay storage means, the value of Y(n+-1)$_i$ from said delay storage means, the value of Y(n+1)$_i$ from said register means and the value of k(n) from said multiplier storage means;

means for selecting Y(n+1)$_i$ stored in said register means and adding it with the value of b(n)$_{i-1}$ output by said delay storage means and storing the sum in said sum storage means; and timing means for cycling the value of n from its maximum value to its mimimum vlaue, said timing means continually recycling the value of n and initiating the operation of said processor means for each new value of n.

6. A digital lattice filter as set forth in claim 5, wherien said multiplier storage means comprises a circulating data register controlled by said timing means that outputs data as a function of the value of n.

7. A digital lattice filter as set forth in claim 5, wherein said delay storage means comprises:
a first-in first-out data register stack having a predetermined number of registers contained therein, data stored in said first-in first-out stack incremented in response to the value of n decrementing by said timing means to delay the values of b(n+1)$_i$ input thereto for use in calculating subsequent equations.

8. A digital lattice filter as set forth in claim 5, further comprising means for selectively altering the value of the multiplier constants k(n) stored in said multiplier storage means.

9. A digital lattice filter as set forth in claim 5, wherein said predetermined multiplication algorithm comprises a modified Booth's algorithm and said multiplier means comprising:
partial product means for generating partial products of the selected multiplier, constant k(n) and multiplicand according to the modified Booth's algorithm;
a first switch seletively connected to one input of said adder for selecting between either the first generated partial product from said partial product means for input thereto or the summation output of the adder for recycling back to one input of said adder;
a second switch selectively connected to the other input of said adder for inputting the remaining partial products from said partial product means thereto; and
said first and second switches operable to first add the first and second partial products to generate an intermediate sum and then add the intermediate sum with the third partial product to generate a second intermediate sum and sequentially add intemreidate sums to the remaining partial products to generate the final product.

10. A method for calculating Y-values and b-values in a digital lattice filter operated in accordance with a linear predictive coding voice compression technique and utilizing the following equations:

$$Y(n)_i = y(n+1)_i - k(n)(Y(n+1)_i + b(n)_{i-1})$$

$$b(n+1)_i = b(n)_{i-1} + k(n)(Y(n+1)_i + b(n)_{i-1})$$

where:
n is the stage through which data is being processed,
n+1 is the previous stage to the nth stage,
i is the cycle that is being processed,
i−1 is the previous cycle to the ith cycle,
Y is the forward transfer coefficient,
b is the reflection coefficient, and
k is the multiplier constant that is stored, said method comprising:
storing the k(n) multiplier constants in a predetermined order in a multiplier storage means and outputting the stored multiplier constants k(n) as a function of n;
receiving and storing generated values of b(n)$_i$ in a given i sample time in a delay storage means and outputting the value of b(n)$_{i-1}$ after a predetermined amount of delay in the next i sample time;
receiving and storing the value of Y(n)$_i$ in a register means and outputting the stored value as Y(n+1)$_i$ for the next successive value of n;
summing in an adder the values of Y(n+1)$_i$ and b(n)$_{i-1}$ to provide a multiplicand;
multiplying in a multiplier the value of k(n) by the multiplicand to generate the product k(n)(Y(n+1)$_i$+b(n)$_{i-1}$);
storing the generated product in a register for use in both Y-value and b-value calculation such that only one multiplication step is required for both calculations;
retrieving the product from the register and summing the product with the value of b(n)$_{i-1}$ in the adder to generate b(n+1)$_i$; and
decrementing the value of n from a maximum to a minimum in a given i sample time.

* * * * *